United States Patent
Lee et al.

(10) Patent No.: US 10,527,694 B2
(45) Date of Patent: Jan. 7, 2020

(54) MAGNETIC RESONANCE IMAGING SYSTEM AND AN ASSOCIATED METHOD THEREOF

(71) Applicant: General Electric Company, Schenectady, NY (US)

(72) Inventors: Seung-Kyun Lee, Cohoes, NY (US); Eric William Fiveland, Niskayuna, NY (US); Joseph Edward Piel, Jr., Scotia, NY (US); Bruce D Collick, Madison, WI (US)

(73) Assignee: General Electric Company, Schenectady, NY (US)

(*) Notice: Subject to any disclaimer, the term of this patent is extended or adjusted under 35 U.S.C. 154(b) by 774 days.

(21) Appl. No.: 14/938,891

(22) Filed: Nov. 12, 2015

(65) Prior Publication Data
US 2017/0139022 A1    May 18, 2017

(51) Int. Cl.
*G01R 33/385* (2006.01)
*G01R 33/38* (2006.01)

(52) U.S. Cl.
CPC ..... *G01R 33/3854* (2013.01); *G01R 33/3802* (2013.01); *G01R 33/3858* (2013.01); *G01R 33/3852* (2013.01)

(58) Field of Classification Search
CPC ............ G01R 33/3854; G01R 33/3802; G01R 33/3858; G01R 33/3852
USPC ....................................................... 324/309
See application file for complete search history.

(56) References Cited

U.S. PATENT DOCUMENTS

| | | | | |
|---|---|---|---|---|
| 4,902,995 A | * | 2/1990 | Vermilyea | G01R 33/3815 174/15.4 |
| 5,270,657 A | * | 12/1993 | Wirth | G01R 33/3852 324/318 |
| 5,394,086 A | | 2/1995 | Patrick et al. | |
| 5,708,360 A | | 1/1998 | Yui et al. | |
| 5,764,059 A | | 6/1998 | Mansfield et al. | |
| 5,990,680 A | | 11/1999 | Mansfield | |
| 6,462,547 B1 | | 10/2002 | Heid et al. | |

(Continued)

FOREIGN PATENT DOCUMENTS

JP        2014039633 A        3/2014

OTHER PUBLICATIONS

Edelstein et al., "Making MRI Quieter", Magnetic Resonance Imaging, vol. 20, pp. 155-163, 2002.

*Primary Examiner* — Christopher P McAndrew

(57) ABSTRACT

A magnetic resonance imaging system is disclosed. The magnetic resonance imaging system includes a magnet core that generates a magnetic field including a plurality of magnetic field lines. The magnetic resonance imaging system also includes a plurality of gradient coils disposed along the magnet core and a plurality of gradient amplifiers. Further, the magnetic resonance imaging system includes a plurality of bus-bar conductors coupling a corresponding gradient coil of the plurality of gradient coils and a corresponding gradient amplifier of the plurality of gradient amplifiers. The plurality of bus-bar conductors is disposed along at least one of a first path extending along the plurality of magnetic field lines and a second path extending along a substantially linear direction from the corresponding gradient coil to a fringe region of the magnetic field to reduce an effect of Lorentz force on the plurality of bus-bar conductors.

13 Claims, 7 Drawing Sheets

(56) References Cited

U.S. PATENT DOCUMENTS

| | | |
|---|---|---|
| 7,071,693 B2 | 7/2006 | Yasuhara |
| 7,161,353 B2 | 1/2007 | Schaaf et al. |
| 7,193,416 B2 | 3/2007 | Harvey et al. |
| 7,468,606 B2* | 12/2008 | Eberlein ............... G01R 33/381 |
| | | 324/319 |
| 8,446,024 B2* | 5/2013 | Rozman ................ H02P 27/04 |
| | | 290/31 |
| 8,664,957 B2 | 3/2014 | Obermann |
| 2003/0107376 A1* | 6/2003 | Yasuhara ........... G01R 33/3854 |
| | | 324/318 |
| 2005/0068032 A1 | 3/2005 | Harvey et al. |

* cited by examiner

MAGNETIC RESONANCE IMAGING SYSTEM AND AN ASSOCIATED METHOD THEREOF

BACKGROUND

Embodiments of the present invention generally relate to a magnetic resonance imaging system, and more specifically, to bus-bar conductors for a magnetic resonance imaging system.

In the magnetic resonance imaging (MRI) system, an electrical bus-bar conductor transmits electrical current from a gradient driver to a gradient coil. In an insert gradient coil MRI system, often a gradient coil is much shorter than a magnet core. Therefore, the bus-bar conductors need to be extended significantly closer to the magnet's iso-center for coupling to the gradient coil. Particularly, a significant length of the bus-bar conductors is disposed in a region subjected to influence of a strong magnetic field generated by the magnet core. The parts of the bus-bar conductors proximate to the magnet core are subjected to a strong Lorentz force due to the magnetic field.

The bus-bar conductors are subjected to severe vibrations due to the Lorentz force. The vibration of the bus-bar conductors may also cause mechanical shaking of the patient table and generate acoustic noise in the MRI system.

The Lorentz force also causes intermittent contacts between filaments and joints corresponding to the bus-bar conductors. The metal-to-metal contact between the filaments and the joints causes the generation of an electrical discharge. As a result, white pixel artifacts are generated. Therefore, the quality of acquired image is compromised.

Accordingly, there is a need for a compact and simple design of bus-bar conductors to minimize the effect of Lorentz force in the MRI system.

BRIEF DESCRIPTION

In accordance with one embodiment of the present invention, a magnetic resonance imaging system is disclosed. The magnetic resonance imaging system includes a magnet core that generates a magnetic field including a plurality of magnetic field lines. The magnetic resonance imaging system also includes a plurality of gradient coils disposed along the magnet core, and a plurality of gradient amplifiers. Further, the magnetic resonance imaging system includes a plurality of bus-bar conductors coupling a corresponding gradient coil of the plurality of gradient coils and a corresponding gradient amplifier of the plurality of gradient amplifiers. The plurality of bus-bar conductors is disposed along at least one of a first path extending along the plurality of magnetic field lines and a second path extending along a substantially linear direction from the corresponding gradient coil to a fringe region of the magnetic field.

In accordance with another embodiment of the present invention, a method for installing a magnetic resonance imaging system is disclosed. The method includes coupling a plurality of bus-bar conductors to a corresponding gradient coil of a plurality of gradient coils and a corresponding gradient amplifier of a plurality of gradient amplifiers. The plurality of gradient coils is disposed along a magnet core which is configured to generate a magnetic field comprising a plurality of magnetic field lines. Furthermore, the method includes disposing the plurality of bus-bar conductors along at least one of a first path extending along the plurality of magnetic field lines and a second path extending along a substantially linear direction from the corresponding gradient coil to a fringe region of the magnetic field.

In accordance with yet another embodiment of the present invention, a method for operation of a magnetic resonance imaging system is disclosed. The method includes generating a magnetic field including a plurality of magnetic field lines, using a magnetic core. The magnetic resonance imaging system includes a plurality of gradient coils disposed along the magnet core, a plurality of gradient amplifiers, and a plurality of bus-bar conductors coupling a corresponding gradient coil of the plurality of gradient coils and a corresponding gradient amplifier of the plurality of gradient amplifiers. The plurality of bus-bar conductors is disposed along at least one of a first path extending along the plurality of magnetic field lines and a second path extending along a substantially linear direction from the corresponding gradient coil to a fringe region of the magnetic field. Additionally, the method includes transmitting a current through the plurality of bus-bar conductors such that an effect of Lorentz force on the plurality of bus-bar conductors is minimized.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this specification belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean one, some, or all of the listed items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. Furthermore, terms such as "circuit", "circuitry", and "controller" may include either a single component or a plurality of components, which are either active and/or passive and are connected or otherwise coupled together to provide the described function. Also, the term operatively coupled as used herein includes wired coupling, wireless coupling, electrical coupling, magnetic coupling, radio communication, software based communication, or combinations thereof.

As will be described in detail hereinafter, various embodiments of an exemplary magnetic resonance imaging system and a method of installation and operation of the magnetic resonance imaging system are disclosed. Specifically, a bus-bar arrangement in an insert gradient coil magnetic resonance imaging system is disclosed.

Figure 1:
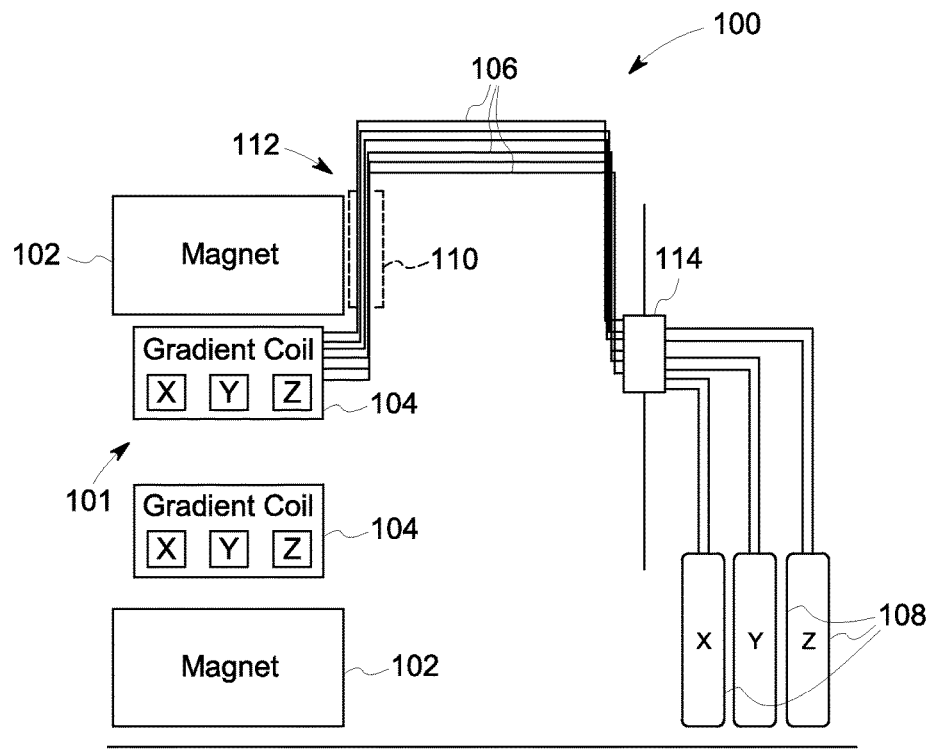
FIG. 1 is a diagrammatical representation of a conventional magnetic resonance imaging system.

Turning now to the drawings and referring to FIG. 1, a diagrammatical representation of a conventional magnetic resonance imaging system 100 is depicted. The conventional MRI system 100 includes a MRI scanner 101 having a magnet core 102 and a plurality of gradient coils 104. The magnet core 102 is configured to generate a magnetic field having a plurality of magnetic field lines.

The MRI system 100 further includes a plurality of gradient amplifiers 108. Each of the gradient coils 104 is operatively coupled to the corresponding gradient amplifier 108 via a plurality of bus-bar conductors 106. Reference numeral 114 represents a filter configured to filter any noise in the current transmitted from the gradient amplifiers 108 to the gradient coils 104. The plurality of bus-bar conductors 106 is held together using the support structure 110. A gradient coil end 112 of the bus-bar conductors 106 is rigidly fixed to the magnet core's flange.

In the MRI system 100, the gradient coils 104 may have a much shorter length than the magnet core 102. In such a scenario, the bus-bar conductors 106 need to extend significantly into the magnet core 102 for connecting to the gradient coils 104. Accordingly, the bus-bar conductors 106 are disposed in a region influenced by a strong magnetic field. Further, the bus-bar conductors 106 are disposed is such a manner that the direction of current transmission through the bus-bar conductors 106 is not in parallel to the magnetic field lines. Further, the bus-bar conductors 106 are disposed in a region influenced by the strong magnetic field for a length of the bus-bar conductors 106. Accordingly, the Lorentz force acting on the bus-bar conductors 106 is considerably high. Therefore, the MRI system 100 is subjected to excessive vibrations.

Figure 2:
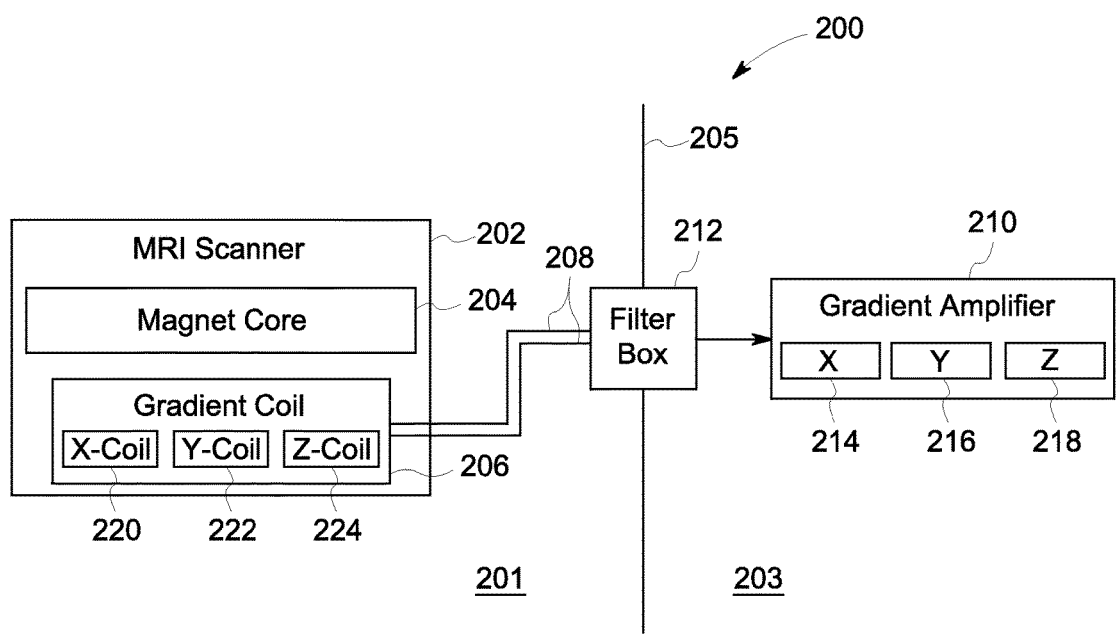
FIG. 2 is a diagrammatical representation of a magnetic resonance imaging system in accordance with an exemplary embodiment of the present invention.

Turning now to FIG. 2, a diagrammatical representation of a magnetic resonance imaging system 200 according to embodiments of the present invention is depicted. The magnetic resonance imaging (MRI) system 200 includes a MRI scanner 202 configured to receive a patient and scan the patient.

The MRI scanner 202 includes a magnet core 204 and a plurality of gradient coils 206. The magnet core 204 is configured to generate a magnetic field having a plurality of magnetic field lines. The magnetic field includes a radial magnetic field component and an axial magnetic field component. The term 'magnetic field' as used herein may be used to refer to an absolute value of a vector sum of the radial magnetic field component and the axial magnetic field component. The plurality of gradient coils 206 is disposed along the magnet core 204. The gradient coils 206 are high-performance insert gradient coils. The gradient coils 206 have a shorter length than the magnet core 204. In one embodiment, the gradient coil 206 is shorter than the magnet core 204 by about 30 centimeters to about 80 centimeters.

The gradient coils 206 include an X-axis coil 220, a Y-axis coil 222, and a Z-axis coil 224. Further, the MRI system 200 includes a plurality of gradient amplifiers 210. In one embodiment, the gradient amplifiers 210 include an X-axis amplifier 214, a Y-axis amplifier 216, and a Z-axis amplifier 218.

In the illustrated embodiment, the MRI scanner 202 is positioned at a first location 201 and the gradient amplifiers 210 are disposed at a second location 203. The first location 201 is a scan room and the second location 203 is an equipment room. The first location 201 and the second location 203 are separated from each other by a penetration wall 205. Further, a filter 212 is positioned on the penetration wall 205. The filter 212 is configured to filter any noise in the current transmitted from the gradient amplifiers 210 to the gradient coils 206. The term "noise" as used herein, may be used to refer to any inhomogeneities in the current.

Specifically, the X-axis coil 220, the Y-axis coil 222, and the Z-axis coil 224 are coupled to the X-axis amplifier 214, the Y-axis amplifier 216, and the Z-axis amplifier 218, respectively. In one non-limiting example, the gradient amplifier 210 corresponding to each gradient coil 206 controls the current transmitted to the gradient coils 206. The current is transmitted from the gradient amplifiers 210 to the corresponding gradient coils 206 via a plurality of bus-bar conductors 208. In particular, each of the gradient coils 206 is coupled to the corresponding gradient amplifier 210 via at least two bus-bar conductors 208. One of the bus-bar conductors 208 is coupled to a positive terminal and the other bus-bar conductor 208 is coupled to a negative terminal. In one embodiment, each of the bus-bar conductors 208 is made of copper. The current transmitted to the gradient coils 206 aids in creating a magnetic field with a desired gradient in the MRI scanner 202.

According to embodiments of the present invention, the plurality of bus-bar conductors 208 is disposed along a first path such that the direction of current transmission through the bus-bar conductors 208 is parallel to the magnetic field lines. In another embodiment, the plurality of bus-bar conductors 208 is disposed along a second path, such that the second path extends along a substantially linear direction from the corresponding gradient coil 206 to a fringe region of the magnetic field. Accordingly, the bus-bar conductors 208 are subjected to minimum Lorentz force. As a result of minimization of the Lorentz force, vibration in the MRI system 200 is considerably reduced. Details pertaining to the first path and the second path are discussed in greater detail with reference to subsequent figures.

Figure 3:
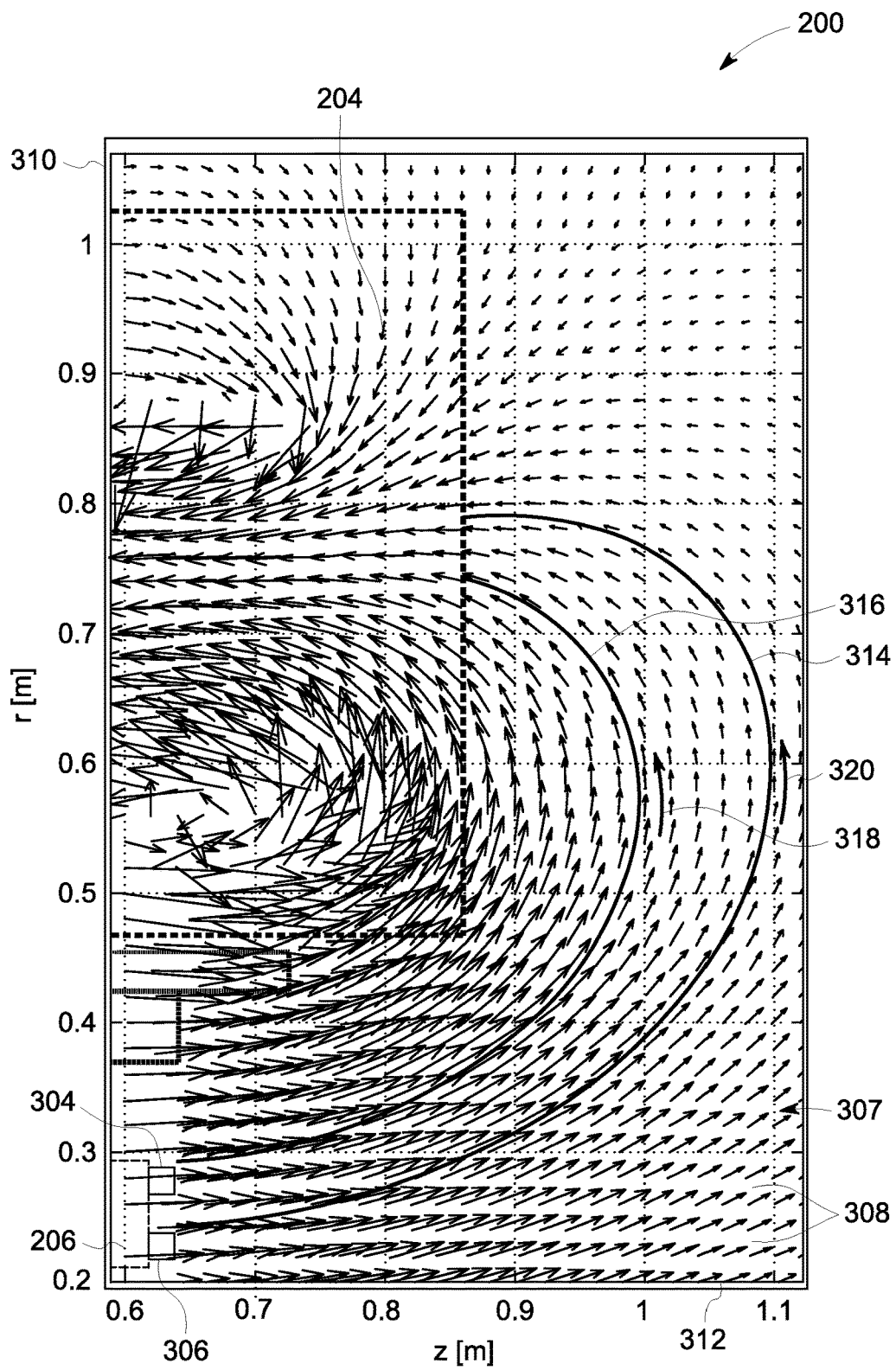
FIG. 3 is a diagrammatical representation of a magnetic resonance imaging system in accordance with the embodiment of FIG. 2.

FIG. 3 is a diagrammatical representation of the magnetic resonance imaging system 200 of FIG. 2 according to embodiments of the present invention. The MRI system 200 includes the magnet core 204 and the plurality of gradient coils 206. Each of the gradient coils 206 includes a positive terminal 304 and a negative terminal 306. The magnet core 204 is configured to generate a magnetic field 307 having a plurality of magnetic field lines 308.

Reference numeral 310 represents a vertical axis r(m) indicative of a radial distance in meters from a center of the magnet core 204 to a location where the magnetic field is calculated. In particular, the magnetic field lines 308 extend over a range of radial distances from about 0.2 meters to about 1.05 meters from the center of magnet core 204. Reference numeral 312 represents a horizontal axis z(m)

indicative of an axial distance from the center of the magnet core 204 to a location where the magnetic field is calculated in meters.

Reference numerals 314 and 316 are representative of first paths. Particularly, the reference numeral 314 represents a first path from the positive terminal 304 to the magnet core 204. Further, the reference numeral 316 represents a first path from the negative terminal 306 to the magnet core 204. The first paths 314, 316 are determined based on position of the magnet core 204 and the corresponding pattern of magnetic field lines 308.

The shape of the first paths 314, 316 is such that if any current carrying bus-bar conductor is positioned along the first paths 314, 316, the direction of transmission of current through the bus-bar conductor is parallel to the magnetic field lines 308. In the presently contemplated configuration, the first paths 314, 316 extend parallely to the magnetic field lines 308, in a radial-axial plane. In the illustrated embodiment, the direction of current transmission is represented by reference numerals 318, 320. Specifically, reference numeral 318 represents the direction of current transmission along the first path 316 and reference numeral 320 represents the direction of current transmission along the first path 314. Particularly, direction of current at any point on the bus-bar conductor along the first paths 314, 316 is parallel to the magnetic field lines 308. The arrangement of bus-bar conductors along the first paths facilitates to minimize the effect of Lorentz force on the bus-bar conductors.

Figure 4:
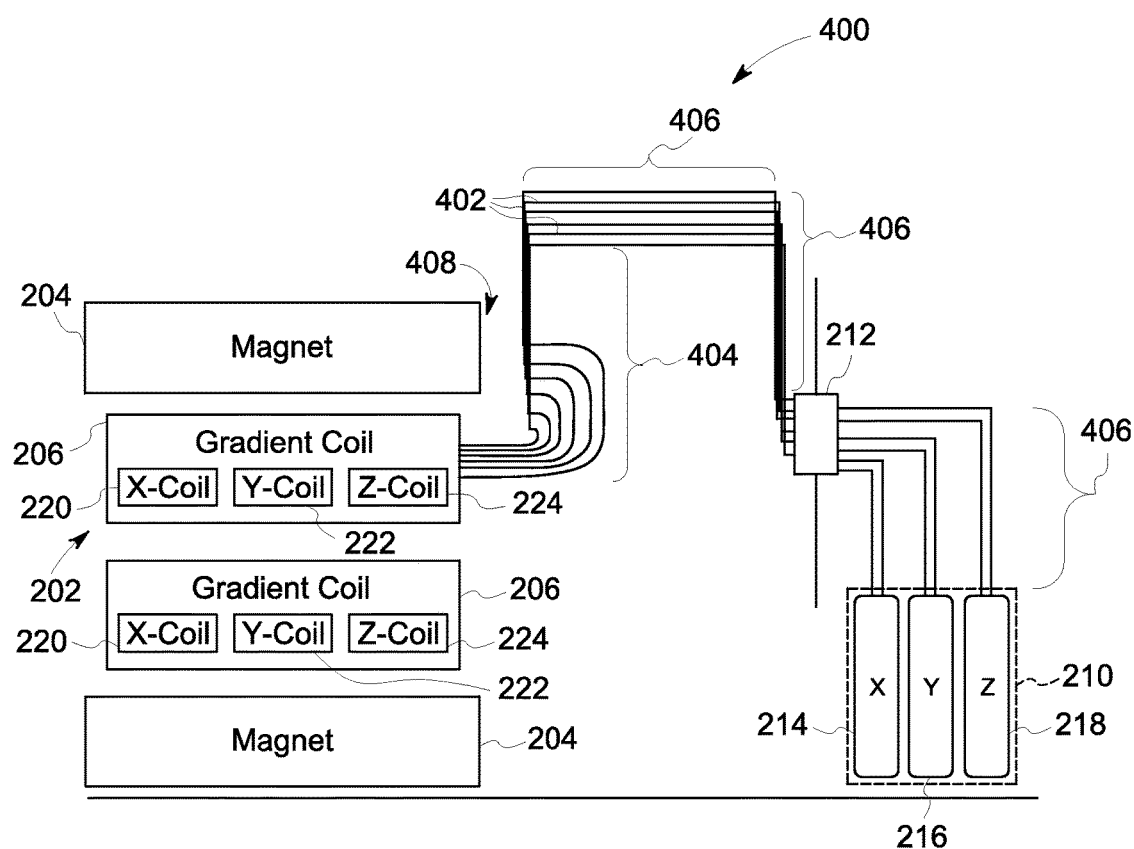
FIG. 4 is a diagrammatical representation of a magnetic resonance imaging system in accordance with another exemplary embodiment of the present invention.

Turning now to FIG. 4, a diagrammatical representation of a magnetic resonance imaging system 400 in accordance with another exemplary embodiment is depicted. The gradient coil 206 includes the X-axis coil 220, the Y-axis coil 222, and the Z-axis coil 224. Each of the X-axis coil 220, the Y-axis coil 222, and the Z-axis coil 224 includes a positive terminal and a negative terminal. The gradient amplifiers 210 include the X-axis amplifier 214, the Y-axis amplifier 216, and the Z-axis amplifier 218. The X-axis coil 220, the Y-axis coil 222, and the Z-axis coil 224 are coupled to the X-axis amplifier 214, the Y-axis amplifier 216, and the Z-axis amplifier 218, respectively. The gradient coils 206 are operatively coupled to the gradient amplifiers 210 via a plurality of bus-bar conductors 402. Each of the X-axis coil 220, the Y-axis coil 222, and the Z-axis coil 224 is coupled to the corresponding gradient amplifier 210 via two bus-bar conductors 402. Accordingly, the gradient coils 206 are coupled to the corresponding gradient amplifiers 210 via six bus-bar conductors 402. Further, the MRI system 400 includes a filter 212 configured to filter any noise in the current transmitted from the gradient amplifiers 210 to the gradient coils 206.

In the illustrated embodiment, the bus-bar conductors 402 have two parts 404 and 406. The parts 404 of the bus-bar conductors 402 are disposed in a region subjected to influence of the magnetic field generated by the magnet core 204. The parts 406 of the bus-bar conductors 402 are disposed in a region subjected to negligible influence of the magnetic field generated by the magnet core 204. The parts 404 of the bus-bar conductors 402 extend from the positive terminal and the negative terminal of the gradient coils 206 to a service-end flange 408 of the magnet core 204. Further, the parts 406 of the bus-bar conductors 402 extend from one end (proximate to the service-end flange 408) of the parts 404 of the bus-bar conductors 402 to the gradient amplifiers 210. In particular, the parts 404 of the bus-bar conductors 402 are connected to the positive terminal and the negative terminal of the gradient coils 206 and the parts 406 of the bus-bar conductors 402 are connected to the gradient amplifiers 210.

The parts 404 of the bus-bar conductors 402 are disposed along the first path (similar to the first paths 314, 316 of FIG. 3) resulting in reduction in effect of Lorentz force on the bus-bar conductors 402. In one embodiment, the Lorentz force acting on the parts 404 disposed along the first path is almost zero. In the illustrated embodiment, the parts 404 of the bus-bar conductors 402 have a curved shape. In other embodiments, the shape of the bus-bar conductors 402 may vary depending on the magnetic field lines.

Figure 5:
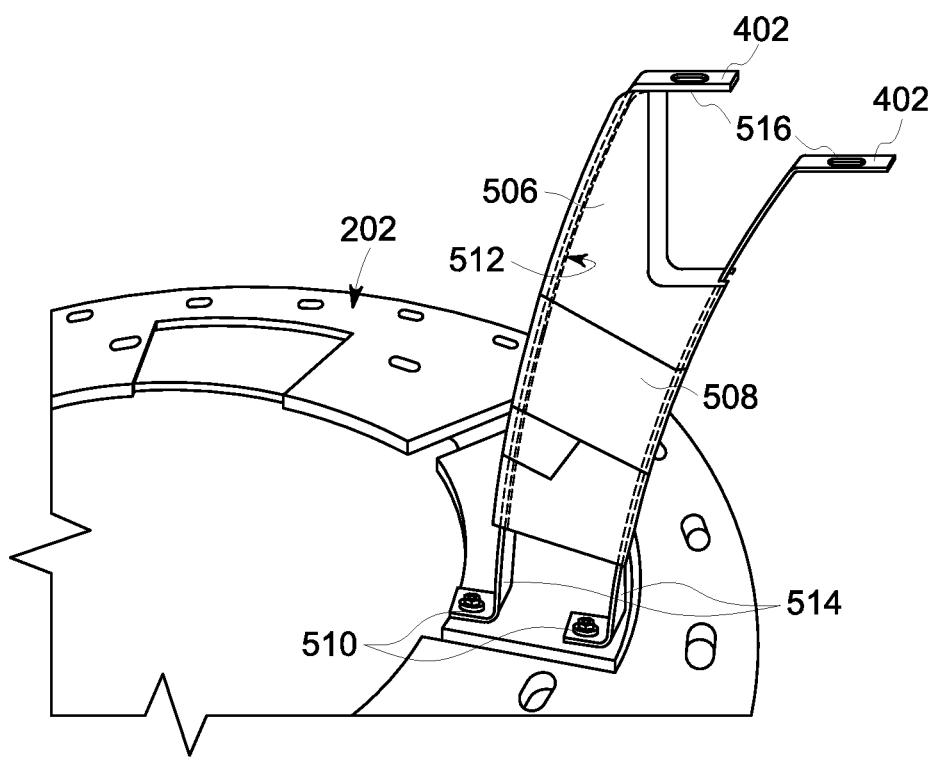
FIG. 5 is an illustrative embodiment of a bus-bar conductor in accordance with the embodiment of FIG. 4.

FIG. 5 is an illustrative embodiment of the bus-bar conductors 402 in accordance with the embodiment of FIG. 4. In particular, the parts 404 of the bus-bar conductors 402 are depicted. In the illustrated embodiment, two bus-bar conductors 402 are depicted. In other embodiments, the number of bus-bar conductors 402 may vary depending on the application.

In one embodiment, the bus-bar conductors 402 are flexible conductors. In such an embodiment, the bus-bar conductors 402 are cut to a predefined length from a heavy-duty cable made of copper. Further, a support structure 506 is coupled to the parts 404 of the bus-bar conductors 402 for supporting parts 404 of the bus-bar conductors 402. The parts 404 of the bus-bar conductors 402 are coupled to the support structure 506 via a fastening unit 508. In one embodiment, the support structure 506 is made of an insulating material. The insulating material may include glass, plastic, polymer, wood, or combinations thereof. The insulating material is configured, as depicted, to take the shape of the region and positioned there between the bus-bar conductors 402.

In the illustrated embodiment, specifically, the support structure 506 includes a plurality of grooves 512. The parts 404 of the bus-bar conductors 402 are disposed in the corresponding grooves 512 and secured to the grooves 512, using the fastening unit 508. The fastening unit 508 may include a tape, in one example. A first end 514 of the parts 404 of the bus-bar conductors 402 is coupled to the positive terminal, such as the positive terminal 304 and the negative terminal such as the negative terminal 306 of FIG. 3, of the gradient coil, using bolts 510. Another end 516 of the parts 404 of the bus-bar conductors 402 is coupled to the parts 406 of the bus-bar conductors which are coupled to the gradient amplifier such as the gradient amplifier 210 of FIG. 2. In another embodiment, the bus-bar conductors 402 are rigid conductors. In such an embodiment, the bus-bar conductors 402 are made by rolling or cutting a copper strip.

Figure 6:
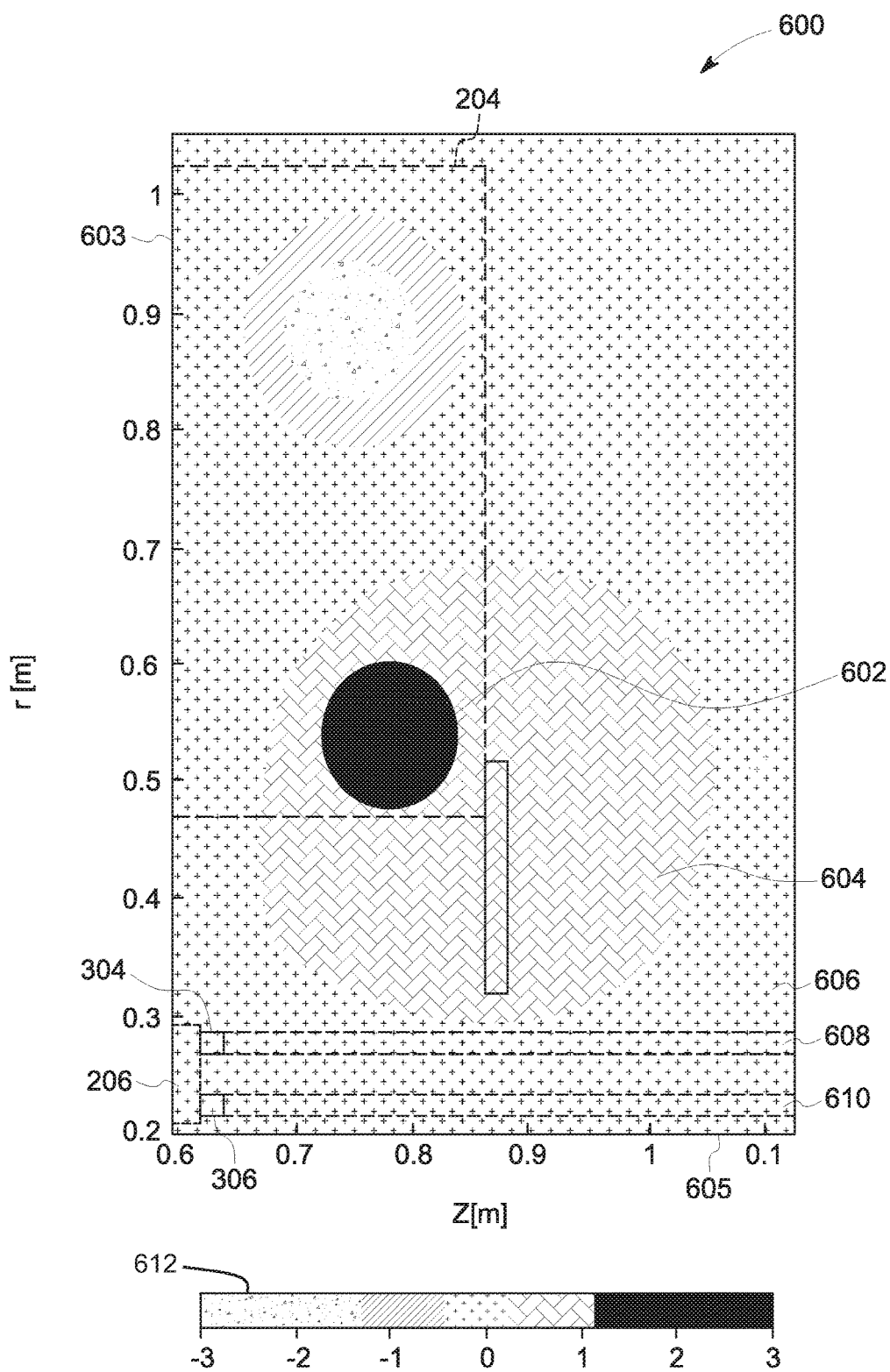
FIG. 6 is a diagrammatical representation of a magnetic resonance imaging system in accordance with yet another embodiment.

FIG. 6 is a diagrammatical representation of another embodiment of a magnetic resonance imaging system 600. The MRI system 600 includes the magnet core 204 and the gradient coils 206. The gradient coil 206 includes the positive terminal 304 and the negative terminal 306. The magnet core 204 is configured to generate the magnetic field, such as the magnetic field 307 of FIG. 3. In the illustrated embodiment, a radial component of magnetic field is represented. In the illustrated embodiment, a region influenced by the magnetic field, has a first zone 602, a second zone 604, and a third zone 606. First zone 602 is influenced by a strong radial magnetic field. The second zone 604 is influenced by a radial magnetic field having a reduced strength compared to the radial magnetic field of the first zone 602. The third zone 606 is referred to as a fringe region of the magnetic field. The terms "third zone" and "fringe region of the magnetic field" may be used interchangeably. The radial magnetic field strength corresponding to the third zone 606 is less than the radial magnetic field strength corresponding to the first zone 602 and second zone 604.

Reference numeral 603 represents a vertical axis r(m) indicative of a radial distance in meters from a center of the magnet core 204 to a location where the magnetic field is calculated. Reference numeral 605 represents a horizontal axis z(m) indicative of an axial distance from the center of the magnet core 204 to a location where the magnetic field is calculated in meters. Further, reference numeral 612 is representative of a scale-bar indicative of a radial magnetic field in Tesla.

As noted hereinabove, the plurality of bus-bar conductors is configured to operatively couple the gradient coil 206 to the corresponding gradient amplifier. In the embodiment of FIG. 6, the bus-bar conductors is disposed along second paths 608, 610. The second path 608 extends from the positive terminal 304 and the second path 610 extends from the negative terminal 306. Specifically, each of the second paths 608, 610 extends along a substantially linear direction from the corresponding gradient coil 206 to the fringe region 606 of the magnetic field 307. Each of the second paths 608, 610 is indicative of the shortest distance path from the gradient coil 206 to the fringe region 606 of the magnetic field 307. In one embodiment, each of the second paths 608, 610 extends substantially in-line along an axial direction of the magnet core 204. In the illustrated embodiment, the Lorentz force acting on the bus-bar conductors disposed along the second paths 608, 610 is minimized because the second paths 608, 610 is indicative of the shortest distance from the gradient coil 206 to the fringe region 606 of the magnetic field 307. In one embodiment, the Lorentz force acting on the bus-bar conductors may be reduced by about 30%-about 90% when compared to Lorentz force in a conventional insert gradient coil MRI system.

Figure 7:
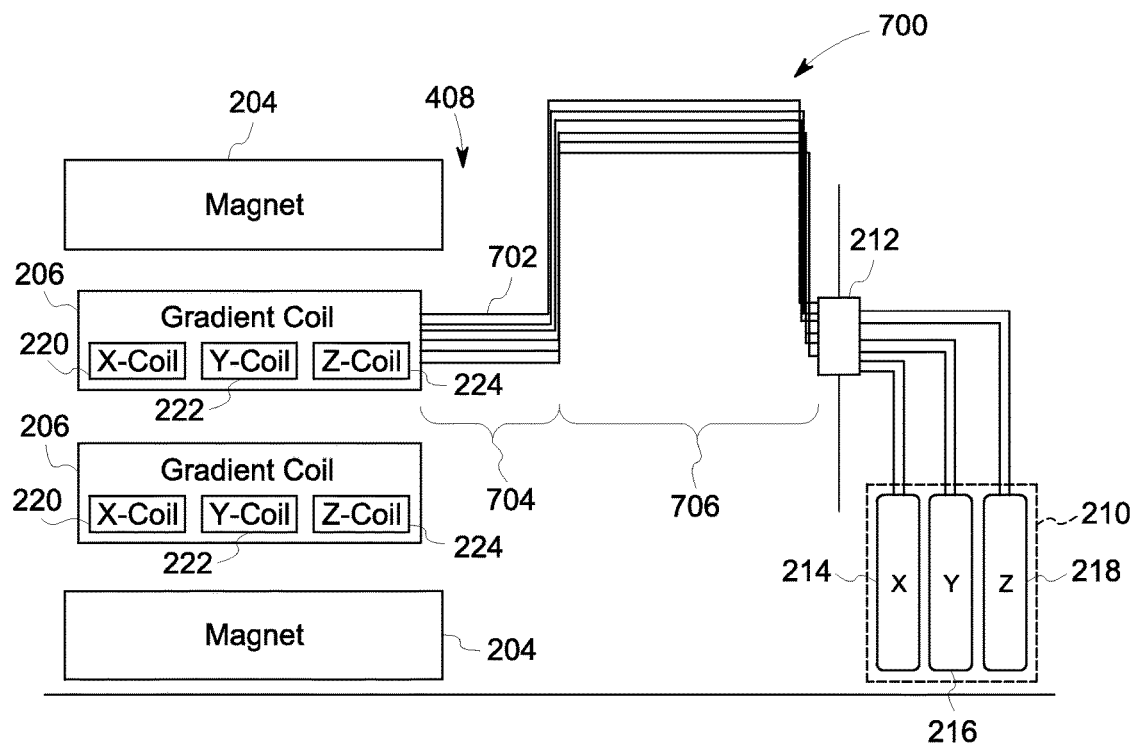
FIG. 7 is a diagrammatical representation of a magnetic resonance imaging system in accordance with yet another exemplary embodiment.

Referring to FIG. 7, a magnetic resonance imaging system 700 in accordance with another embodiment of the present invention is depicted. In particular, FIG. 7 represents the bus-bar conductors 702 disposed along the second paths such as the second paths 608, 610 of FIG. 6. The MRI system 700 includes the MRI scanner 202 having the magnet core 204 and the plurality of gradient coils 206. The gradient coils 206 are operatively coupled to gradient amplifiers 210 via the plurality of bus-bar conductors 702. The bus-bar conductors 702 have a flat shape. Further, the MRI system 700 includes a filter 212 configured to filter any noise in the current transmitted from the gradient amplifiers 210 to the gradient coils 206.

The bus-bar conductors 702 have two parts 704, 706 along the length of the bus-bar conductors 702. The parts 704 of the bus-bar conductors 702 are disposed in a region subjected to influence of the magnetic field generated by the magnet core 204. The parts 706 of the bus-bar conductors 702 are disposed in a region subjected to negligible influence of the magnetic field generated by the magnet core 204. The parts 704 of the bus-bar conductors 702 extend from the positive and negative terminals of the gradient coils 206 to the fringe region of the magnetic field via a shortest distance path. In particular, the parts 704 of the bus-bar conductors 702 represent a second path extending along a substantially linear direction from the corresponding gradient coil 206 to a fringe region of the magnetic field.

Figure 8:
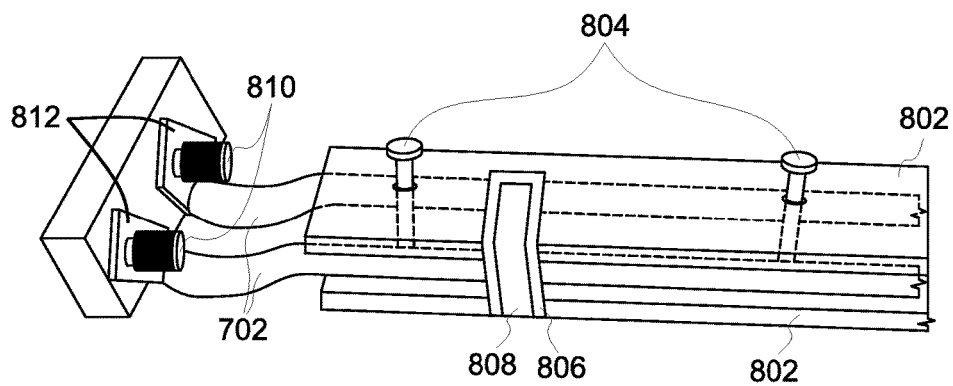
FIG. 8 is an illustrative embodiment of a bus-bar conductor in accordance with the embodiment of FIG. 7.

FIG. 8 is an illustrative embodiment of the bus-bar conductors 702 in accordance with the embodiment of FIG. 7. In one non-limiting example, the bus-bar conductors 702 may be made of 3/0 AWG copper cable. In the illustrated embodiment, one set of the bus-bar conductors 702 is depicted. In particular, the parts 704 (shown in FIG. 7) of one set of the bus-bar conductors 702 are depicted. The parts 704 of the bus-bar conductors 702 are held between two panels 802 bolted together by a fastening unit, for example, a plurality of brass bolts 804. Further, strips 806 are fastened to the two panels 802, using a fastening unit, such as a tape 808. The strips 806 and panels 802 may be made of an insulating material, such as but not limited to transparent plastic of polymethyl methacrylate material, or similar acrylic or acrylic glass or acrylic plastic (e.g., Plexiglas™).

Two terminals 810 of the bus-bar conductors 702 are coupled to a crimp lug. The term "crimp lug" as used herein, refers to a metallic end-piece. In one embodiment, the two terminals 810 are separated by a distance of 5.0 cm. The two terminals 810 are further coupled to the positive terminal and the negative terminal of the gradient coil. In another embodiment, the parts 704 of the bus-bar conductors 702 are 3 feet long. In yet another embodiment, a lateral gap between two bus-bar conductors 702 (from center-to-center) is about 35 mm.

Figure 9:
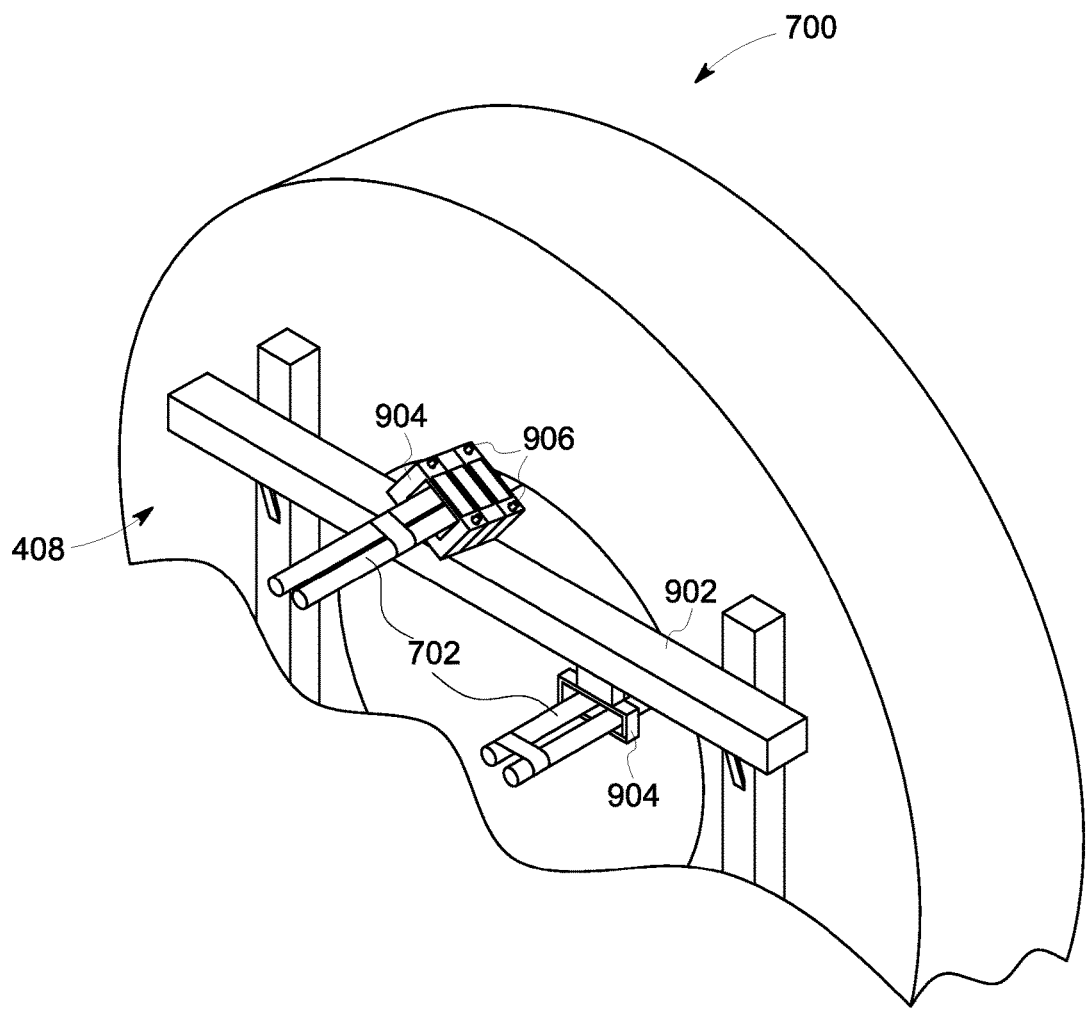
FIG. 9 is an illustrative embodiment of a magnetic resonance imaging system in accordance with yet another exemplary embodiment.

FIG. 9 is an illustrative embodiment of a magnetic resonance imaging system 700 in accordance with an exemplary embodiment of FIG. 8. The MRI system 700 further includes a rigid aluminum frame 902 for holding the bus-bar conductors 702. Specifically, the rigid aluminum frame 902 is coupled to the bus-bar conductors 702, using solid plastic blocks 904 and bolts 906. In the illustrated embodiment, the rigid aluminum frame 902 is a rectangular structure. The rigid aluminum frame 902 is also coupled to the service-end flange 408 of the magnet core via fastening units.

In accordance with the embodiments discussed herein, the bus-bar conductors in the magnetic resonance imaging system are disposed in such a manner that the Lorentz force on the bus-bar conductors is minimized. The vibration of the bus-bar conductors and other components of the MRI system are minimized due to the reduction in Lorentz force. Accordingly, mechanical shaking of any hardware associated with the MRI scanner is reduced. Further, acoustic noise is minimized in the exemplary MRI system. Such an arrangement of bus-bar conductors reduces intermittent metal-to-metal contact which reduces generation of electrical discharge. As a result, the white pixel artifacts are significantly reduced. Accordingly, a good quality image is obtained using the MRI system.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A magnetic resonance imaging system comprising:
   a magnet core that generates a magnetic field comprising a plurality of magnetic field lines;
   a plurality of gradient coils disposed along the magnet core;
   a plurality of gradient amplifiers; and
   a plurality of bus-bar conductors each connecting a corresponding gradient coil of the plurality of gradient coils to a corresponding gradient amplifier of the plurality of gradient amplifiers, wherein the plurality of bus-bar conductors is disposed along a path extending along the plurality of magnetic field lines in a radial-axial plane from the corresponding gradient coil to a fringe region of the magnetic field.

2. The magnetic resonance imaging system of claim 1, further comprising a support structure coupled to the plurality of bus-bar conductors, for supporting the plurality of bus-bar conductors.

3. The magnetic resonance imaging system of claim 2, further comprising a fastening unit for fastening the plurality of bus-bar conductors to the support structure.

4. The magnetic resonance imaging system of claim 2, wherein at least one of the plurality of bus-bar conductors comprises a copper strip.

5. The magnetic resonance imaging system of claim 2, wherein the support structure comprises an insulating material.

6. The magnetic resonance imaging system of claim 5, wherein the insulating material comprises glass, plastic, polymer, wood, or combinations thereof.

7. The magnetic resonance imaging system of claim 1, wherein at least one of the plurality of bus-bar conductors has a curved shape.

8. The magnetic resonance imaging system of claim 1, wherein at least one of the plurality of bus-bar conductors has a flat shape.

9. The magnetic resonance imaging system of claim 1, wherein the plurality of bus-bar conductors disposed along the path are configured to minimize effect of Lorentz force.

10. A method for installing a magnetic resonance imaging system, the method comprising:
using a plurality of bus-bar conductors to each connect a corresponding gradient coil of a plurality of gradient coils to a corresponding gradient amplifier of a plurality of gradient amplifiers, wherein the plurality of gradient coils is disposed along a magnet core which is configured to generate a magnetic field comprising a plurality of magnetic field lines; and
disposing the plurality of bus-bar conductors along a path extending along the plurality of magnetic field lines in a radial-axial plane from the corresponding gradient coil to a fringe region of the magnetic field.

11. The method of claim 10, further comprising coupling a support structure to the plurality of bus-bar conductors.

12. The method of claim 11, further comprising coupling the plurality of bus-bar conductors to the support structure via a fastening unit.

13. A method for operation of a magnetic resonance imaging system, the method comprising:
generating a magnetic field comprising a plurality of magnetic field lines, using a magnetic core, wherein the magnetic resonance imaging system comprises:
a plurality of gradient coils is disposed along the magnet core;
a plurality of gradient amplifiers; and
a plurality of bus-bar conductors each connecting a corresponding gradient coil of the plurality of gradient coils to a corresponding gradient amplifier of the plurality of gradient amplifiers, wherein the plurality of bus-bar conductors is disposed along a path extending along the plurality of magnetic field lines in a radial-axial plane from the corresponding gradient coil to a fringe region of the magnetic field; and
transmitting a current through the plurality of bus-bar conductors such that an effect of Lorentz force on the plurality of bus-bar conductors is minimized.

* * * * *